US007852685B2

(12) United States Patent
Iwasa et al.

(10) Patent No.: US 7,852,685 B2
(45) Date of Patent: Dec. 14, 2010

(54) SEMICONDUCTOR MEMORY DEVICE

(75) Inventors: Kiyoaki Iwasa, Yokohama (JP); Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 12/406,552

(22) Filed: Mar. 18, 2009

(65) Prior Publication Data
US 2009/0244991 A1 Oct. 1, 2009

(30) Foreign Application Priority Data
Mar. 25, 2008 (JP) .............................. 2008-078863

(51) Int. Cl.
*G11C 7/10* (2006.01)
(52) U.S. Cl. ........................... 365/189.08; 365/189.07; 365/189.12
(58) Field of Classification Search ............ 365/189.08, 365/189.07, 891.12, 221, 51
See application file for complete search history.

(56) References Cited

U.S. PATENT DOCUMENTS 6,966,017 B2 * 11/2005 Evans ......................... 714/718
6,999,352 B2   2/2006 Yoshida et al.
7,426,663 B2 * 9/2008 Takazawa et al. ........... 714/718
2006/0215473 A1  9/2006 Dietrich
2008/0101131 A1  5/2008 Lee et al.

FOREIGN PATENT DOCUMENTS

| JP | 59-212027   | 11/1984 |
| JP | 9-274796    | 10/1997 |
| JP | 2004-133961 | 4/2004  |

* cited by examiner

*Primary Examiner*—Gene N Auduong
(74) *Attorney, Agent, or Firm*—Oblon, Spivak, McClelland, Maier & Neustadt, L.L.P.

(57) ABSTRACT

A semiconductor memory device comprises a first exclusive-OR circuit which compares mth N-bit first data with (m+1)th N-bit second data, a majority circuit which generates flag data to invert the second data if a comparison result of the first exclusive-OR circuit indicates that the number of mismatch bits between the first data and the second data is not less than N/2, and generates flag data to noninvert the second data if the number of mismatch bits between the first data and the second data is less than N/2, a second exclusive-OR circuit which inverts or noninverts the second data based on the flag data, a shift register which stores the flag data generated by the majority circuit, and a pad to serially output both the inverted or noninverted second data and the flag data.

14 Claims, 7 Drawing Sheets

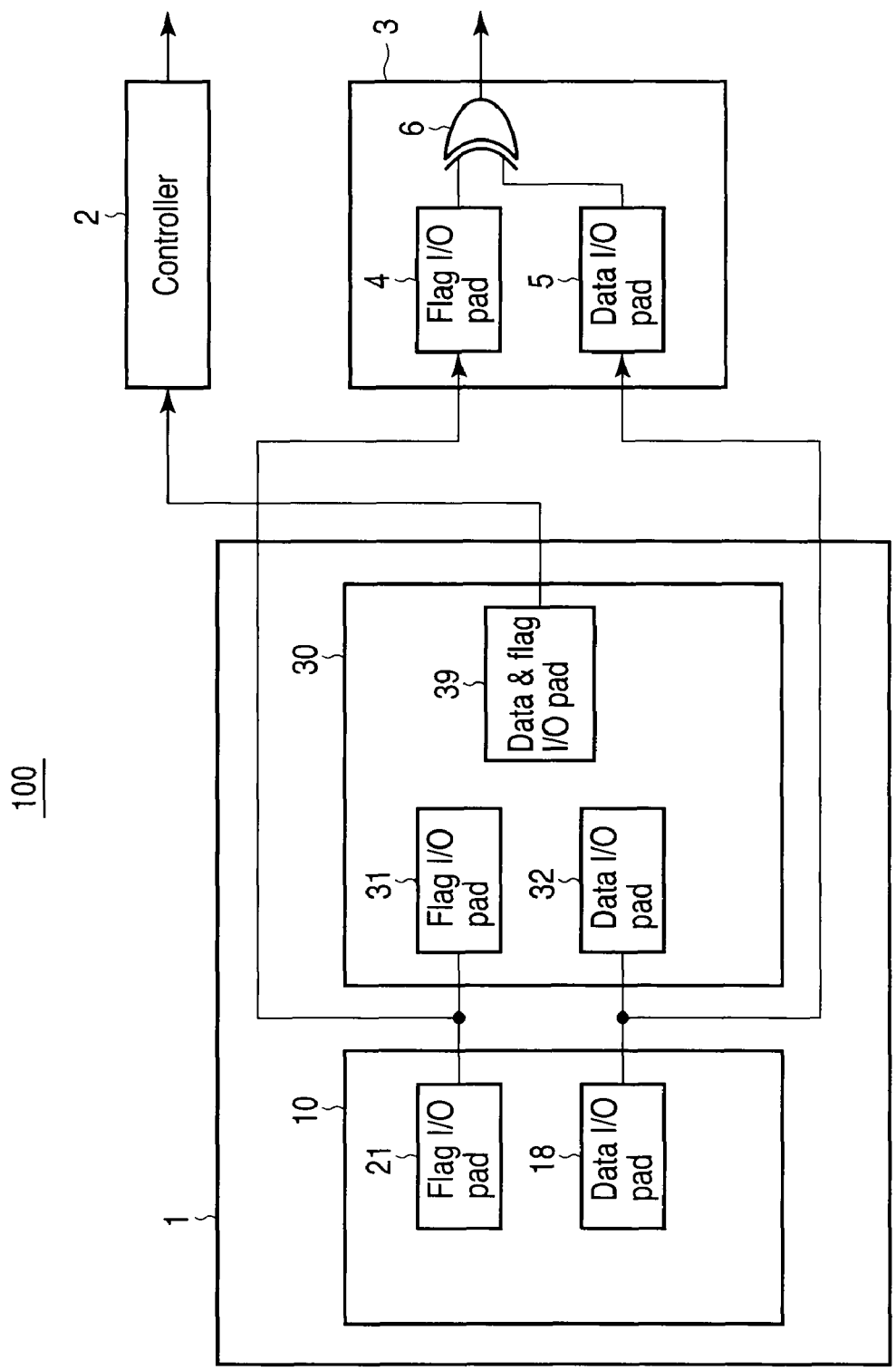
F I G. 3

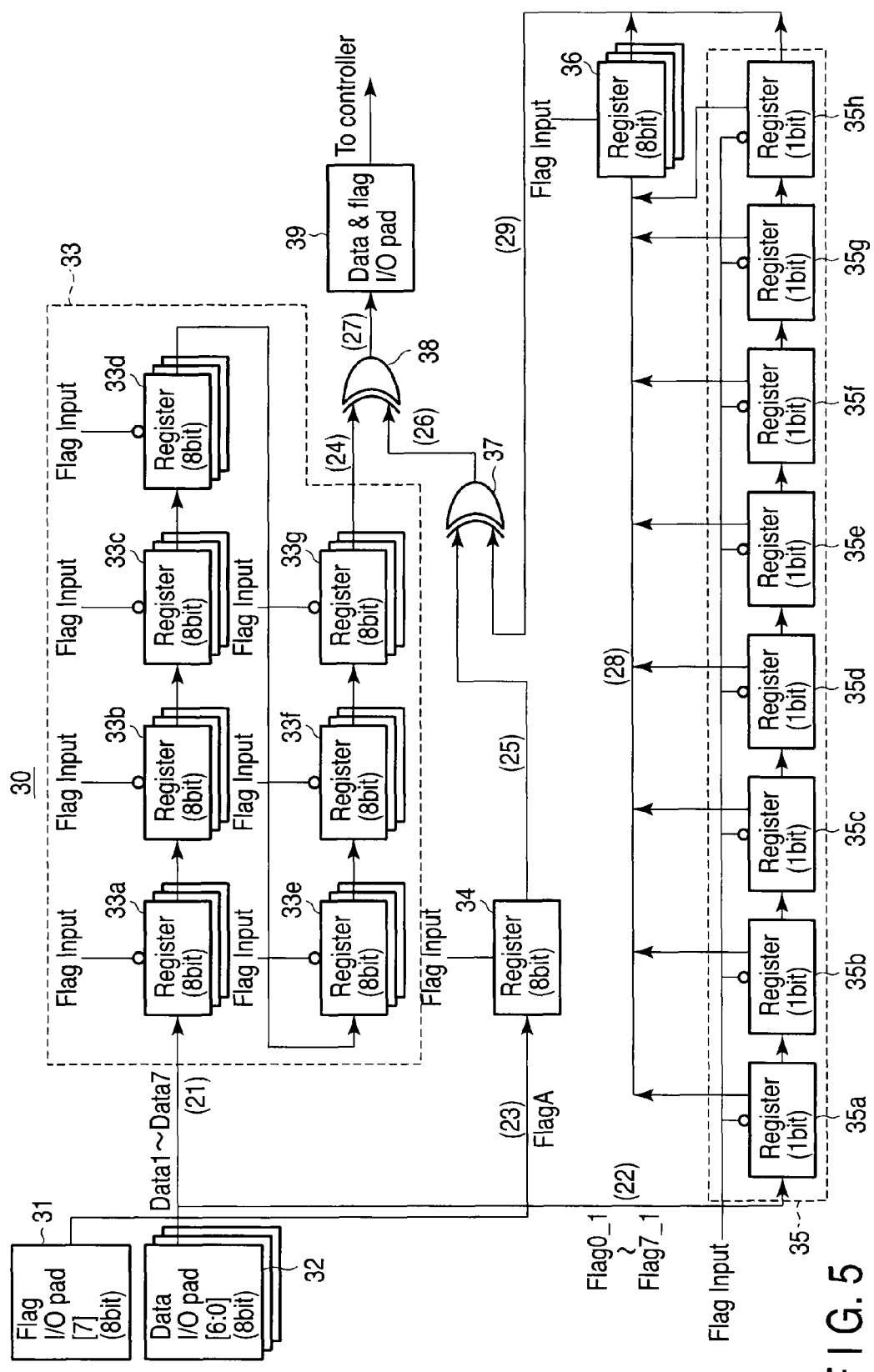
F I G. 5

US 7,852,685 B2

SEMICONDUCTOR MEMORY DEVICE

CROSS-REFERENCE TO RELATED APPLICATIONS

This application is based upon and claims the benefit of priority from prior Japanese Patent Application No. 2008-078863, filed Mar. 25, 2008, the entire contents of which are incorporated herein by reference.

BACKGROUND OF THE INVENTION

1. Field of the Invention

The present invention relates to a semiconductor memory device including a circuit which converts data on a data bus from its original data pattern.

2. Description of the Related Art

In data transfer of a conventional nonvolatile semiconductor memory device, data on a data bus is output from an I/O pad without changing its pattern. In the conventional method, even when a number of data bits change from ALL"0" to ALL"1", or from ALL"1" to ALL"0", the data is transmitted without changing the pattern, resulting in an increase in current consumption. A data inversion technique is known as a solution to this problem. The data inversion technique can reduce the number of times of transitions in inversion of a logic circuit.

For data transfer using the conventional data inversion technique, it is necessary to provide a pad to output flag data in addition to a pad to output actual data (e.g., Jpn. Pat. Appln. KOKAI Publication No. 2004-133961). An output pad for a read enable signal RE and a write enable signal WE is sometimes used as the flag data output pad. In this case, however, it is difficult to adjust the output timings of flag data and the signals RE and WE.

BRIEF SUMMARY OF THE INVENTION

A semiconductor memory device according to an aspect of the present invention comprises a first exclusive-OR circuit which compares mth N-bit first data with (m+1)th N-bit second data; a majority circuit which generates flag data to invert the second data if a comparison result of the first exclusive-OR circuit indicates that the number of mismatch bits between the first data and the second data is not less than N/2, and generates flag data to noninvert the second data if the number of mismatch bits between the first data and the second data is less than N/2; a second exclusive-OR circuit which inverts or noninverts the second data based on the flag data; a shift register which stores the flag data generated by the majority circuit; and a pad to serially output both the inverted or noninverted second data and the flag data.

A semiconductor device according to an aspect of the present invention, the semiconductor device formed by stacking, by MCP, chips each having a semiconductor memory device, the semiconductor memory device comprises a first exclusive-OR circuit which compares mth N-bit first data with (m+1)th N-bit second data; a majority circuit which generates flag data to invert the second data if a comparison result of the first exclusive-OR circuit indicates that the number of mismatch bits between the first data and the second data is not less than N/2, and generates flag data to noninvert the second data if the number of mismatch bits between the first data and the second data is less than N/2; a second exclusive-OR circuit which inverts or noninverts the second data based on the flag data; a shift register which stores the flag data generated by the majority circuit; and a pad to serially output both the inverted or noninverted second data and the flag data.

BRIEF DESCRIPTION OF THE SEVERAL VIEWS OF THE DRAWING

FIG. 3 is a block diagram showing the outline of a semiconductor device according to an embodiment of the present invention;

FIG. 5 is a block diagram showing the detailed circuit arrangement of an I/O data & flag serial output circuit according to an embodiment of the present invention;

DETAILED DESCRIPTION OF THE INVENTION

Figure 1:
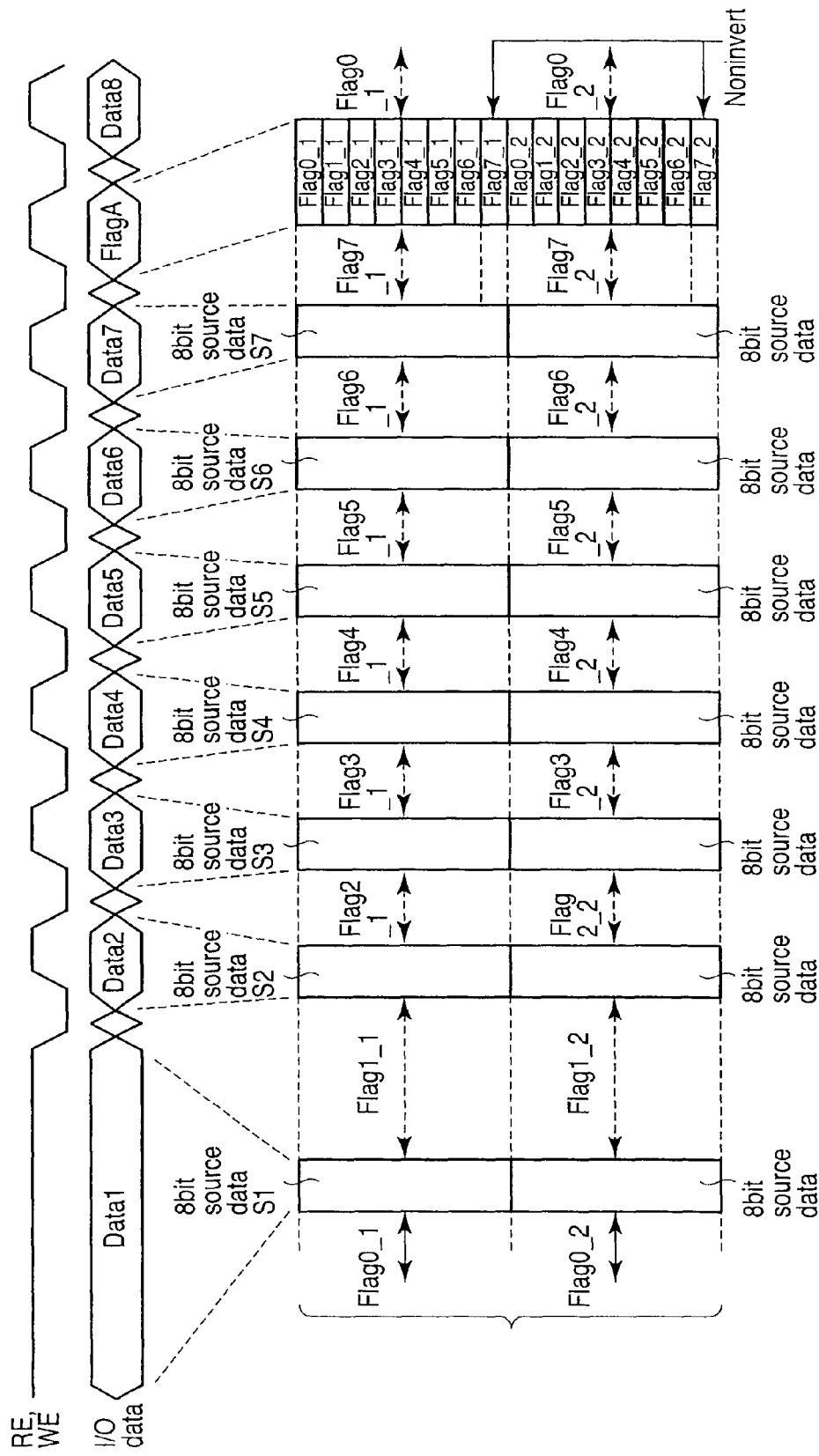
FIG. 1 is a view for explaining a data transfer method using a data inversion technique according to an embodiment of the present invention.

An embodiment of the present invention will now be described with reference to the accompanying drawing. In the following explanation, the same reference numerals denote the same parts throughout the drawing.

[1] Outline

A data transfer method using a data inversion technique according to an embodiment of the present invention will be described with reference to FIG. 1. In this case, 8-bit data are used.

In this embodiment, data Data1 to Data7 each having 8 bits and transferred on a data bus are sequentially output from an I/O pad. After that, flag data Flag0_1 to Flag7_1 corresponding to the data Data1 to Data7 are output as flag data FlagA at once. That is, the data Data1 to Data7 and the flag data FlagA are serially output from a single I/O pad. More specifically, the data transfer is done in the following way.

Concerning output of the data Data1, source data before first source data S1 does not exist. Hence, the source data S1 is compared with data (ALL"0") reset on the circuit side, thereby deciding the output data Data1 and the flag data Flag0_1. Concerning output of the data Data2, second source data S2 is compared with the immediately preceding data Data1, thereby deciding the output data Data2 and the flag data Flag1_1. This processing is repeated for the subsequent data Data3 to Data7.

Concerning output of the flag data FlagA, the eight flag data Flag0_1 to Flag7_1 are output together next to the data Data7, as shown in FIG. 1. The flag data Flag7_1 is decided by comparing the data Data7 with the flag data Flag0_1 to Flag7_1. The flag data FlagA is decided based on the flag data Flag7_1. The flag data Flag7_1 of the flag data FlagA is a dummy flag which is not inverted. This aims at preventing any difficulty in determining whether a flag is set or not if flag data is inverted as a result of comparison.

Figure 2:
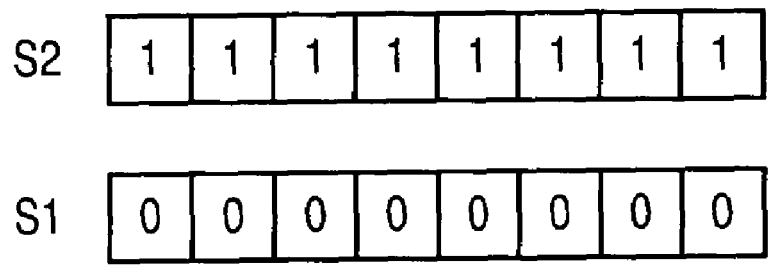
FIG. 2 is a view for explaining how to set flags based on 8-bit data according to an embodiment of the present invention.
Figure 2:
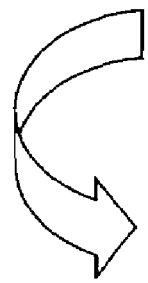
Figure 2:
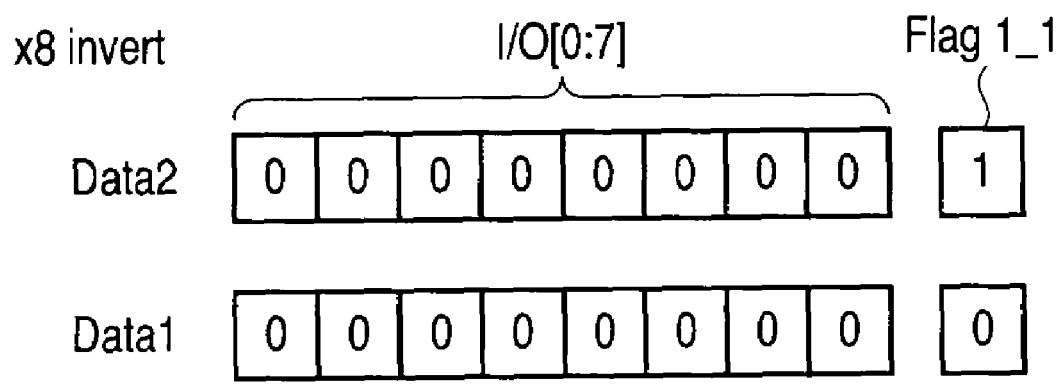

How to set flags based on 8-bit data will be explained with reference to FIG. 2. As shown in FIG. 2, the second source data S2 is ALL"1". The source data S2 is compared with the first source data S1. The flag Flag1_1 is set ("1"), and the second source data S2 is inverted to ALL"0". This suppresses current consumption.

[2] Semiconductor Device

The outline of a semiconductor device according to an embodiment of the present invention will be described with reference to FIG. 3. As shown in FIG. 3, a semiconductor device 100 includes a semiconductor memory device 1, controller 2, and I/O data reconstruction circuit 3.

The semiconductor memory device 1 includes an I/O data majority inverting circuit 10 and an I/O data & flag serial output circuit 30. The semiconductor memory device 1 sets a flag upon inverting I/O data and serially outputs both the inverted data and the flag data from one pad 39.

The I/O data majority inverting circuit 10 compares preceding and succeeding I/O data on the data bus, sets a flag upon inverting the I/O data, outputs the inverted or noninverted I/O data from a data I/O pad 18, and outputs the flag data from a flag I/O pad 21. The I/O data majority inverting circuit 10 will be described later in detail with reference to FIG. 4.

The I/O data & flag serial output circuit 30 receives the inverted or noninverted I/O data from the I/O data majority inverting circuit 10 via a data I/O pad 32, receives the flag data from the I/O data majority inverting circuit 10 via a flag I/O pad 31, and serially outputs both the inverted or noninverted I/O data and the flag data from the data & flag I/O pad 39. The I/O data & flag serial output circuit 30 will be described later in detail with reference to FIG. 5.

Data reconstruction in the above-described embodiment is performed in, e.g., the following manner. When both inverted data and flag data are serially output from the single pad 39, the controller 2 reconstructs the inverted data and the flag data. The I/O data reconstruction circuit 3 may parallelly receive and reconstruct the inverted data and the flag data via a pad 4 and 5. The circuit for reconstructing inverted data is not limited to the controller 2 and the I/O data reconstruction circuit 3 and can be modified variously.

[3] I/O Data Majority Inverting Circuit

[3-1] Circuit Arrangement

Figure 4:
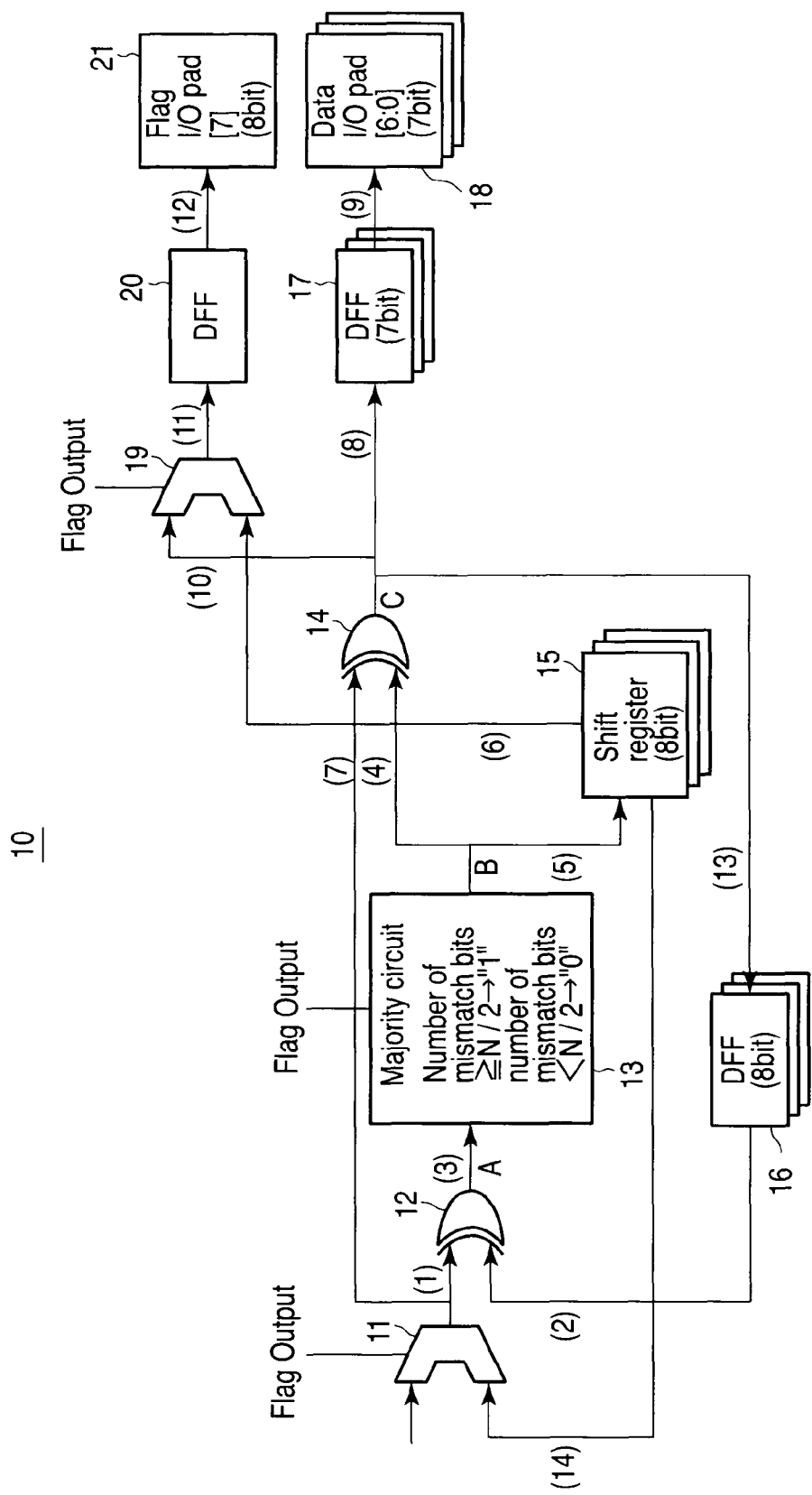
FIG. 4 is a block diagram showing the detailed circuit arrangement of an I/O data majority inverting circuit according to an embodiment of the present invention.

The detailed circuit arrangement of the I/O data majority inverting circuit 10 shown in FIG. 3 will be described with reference to FIG. 4.

The I/O data majority inverting circuit 10 includes arithmetic units 11 and 19, exclusive-OR circuits (EXOR circuits) 12 and 14, a majority circuit 13, a shift register 15, D flip-flops (DFFs) 16, 17, and 20, the data I/O pad 18, and the flag I/O pad 21.

The arithmetic unit 11 receives source data and flag data. The source data is N-bit (e.g., 8-bit) data transferred on the data bus. The flag data contains N data bits (e.g., flag data Flag0_1 to Flag7_1 in FIG. 1) transferred from the shift register 15. The arithmetic unit 11 outputs source data when Flag Output is low, and flag data when the Flag Output is high.

The exclusive-OR circuit 12 compares the logic value bits of the mth source data with those of the (m+1)th source data, and outputs a logic value A representing whether the bits match. More specifically, the exclusive-OR circuit 12 outputs the N-bit logic value A in which "1" represents that the bits of the two N-bit data do not match, and "0" represents a match.

The majority circuit 13 receives the N-bit logic value A, determines whether the N-bit logic value A includes, e.g., N/2 or more bits representing a mismatch ("1"), and outputs the determination result as a logic value B. For example, if N/2 or more bits represent a mismatch, the logic value B of the determination result is set to "1". If the number of bits representing a mismatch is smaller than N/2, the logic value B of the determination result is set to "0".

The exclusive-OR circuit 14 compares the source data output from the arithmetic unit 11 with the logic value B representing the determination result of the majority circuit 13, decides whether or not to invert the source data, and outputs inverted or noninverted data C. More specifically, when the logic value B is "1", the exclusive-OR circuit 14 inverts (logically negates) the logic values of the bits of the source data and outputs the data. When the logic value B is "0", the exclusive-OR circuit 14 directly outputs the source data.

The shift register 15 stores flag data ("1" or "0") based on the logic value B of the determination result of the majority circuit 13. The shift register 15 stores N flag data bits based on the logic values B. The N-bit flag data is input to the arithmetic unit 11.

When the arithmetic unit 19 receives the inverted or noninverted data C output from the exclusive-OR circuit 14, Flag Output goes high. The arithmetic unit 19 outputs the flag data from the shift register 15.

The D flip-flop 16 stores the inverted or noninverted data C output from the exclusive-OR circuit 14. The stored inverted or noninverted data C is input to the exclusive-OR circuit 12 and compared with the next data. That is, the D flip-flop 16 stores the inverted or noninverted data C immediately before the source data.

The D flip-flop 17 stores the inverted or noninverted data C output from the exclusive-OR circuit 14.

The D flip-flop 20 stores the flag data output from the arithmetic unit 19.

The data I/O pad 18 outputs the inverted or noninverted data C. For example, the data I/O pad 18 includes an output buffer and a circuit for preventing circuit destruction by electrical stress.

The flag I/O pad 21 outputs the flag data. For example, the flag I/O pad 21 includes an output buffer and a circuit for preventing circuit destruction by electrical stress.

[3-2] Operation

To sequentially transfer, e.g., 8-bit I/O data through the I/O data majority inverting circuit 10 having the above-described arrangement, the following operation is performed.

First, 8-bit source data is input to the arithmetic unit 11. If Flag Output is low, the arithmetic unit 11 outputs the source data. The exclusive-OR circuit 12 receives the (m+1)th source data from the arithmetic unit 11 (flow (1)) and the mth inverted or noninverted data from the D flip-flop 16 (flow (2)). The exclusive-OR circuit 12 compares the logic value bits of the mth source data with those of the (m+1)th data. As a result, the 8-bit logic value A is output in which "1" represents that the bits of the two N-bit data do not match, and "0" represents a match (flow (3)).

Next, the majority circuit 13 determines whether the 8-bit logic value A includes five or more bits representing a mismatch ("1") between the mth source data and the (m+1)th source data. If the number of mismatch bits is five or more, the logic value B is output as "1". If the number of mismatch bits is four or less, the logic value B is output as "0". The logic value B corresponds to, e.g., each of the flag data Flag0_1 to Flag6_1 in FIG. 1.

The exclusive-OR circuit 14 receives flag data with the logic value B ("1" or "0") output from the majority circuit 13 (flow (4)) and also receives the source data output from the arithmetic unit 11 (flow (7)). The exclusive-OR circuit 14 compares the source data with the flag data having the logic value B, and decides whether or not to invert the source data. When the logic value B is "1", the exclusive-OR circuit 14 outputs the data C in which the logic values of the bits of the source data are inverted (logically negated). When the logic value B is "0", the exclusive-OR circuit 14 directly outputs the source data C. The inverted or noninverted data C corresponds to, e.g., each of the data Data1 to Data7 in FIG. 1.

The inverted or noninverted data C is input to the D flip-flop 17 (flow (8)). The data C corresponding to 7 bits are sequentially output from the data I/O pad 18 (flow (9)). When the inverted or noninverted data C is input to the arithmetic unit 19 (flow (10)), Flag Output simultaneously goes high, and the arithmetic unit 19 outputs the flag data from the shift register 15 (flow (11)). The flag data is input to the D flip-flop 20, and 8-bit flag data is output from the flag I/O pad 21 (flow (12)). The inverted or noninverted data C is also input to the D flip-flop 16 (flow (13)).

In this embodiment, the flag data Flag0_1 to Flag7_1 corresponding to the data Data1 to Data7 are put together into a flag data group, as shown in FIG. 1. The flag data group is compared with seventh source data S7. This is done in the following way. If Flag Output of the arithmetic unit 11 is high, it outputs the 8-bit flag data group Flag0_1 to Flag7_1 output from the shift register 15. The flag data group Flag0_1 to Flag7_1 is input to the exclusive-OR circuits 12 and 14 (flows (1) and (7)). The exclusive-OR circuit 12 compares the logic value bits of the flag data group Flag0_1 to Flag7_1 with those of the seventh source data S7, and consequently outputs the 8-bit logic value A (flow (3)). The number of mismatch bits is determined based on the logic value A, and the logic value B is output. The logic value B corresponds to, e.g., the flag data Flag7_1 in FIG. 1. From then on, calculation is performed using the same method as that described above for each data.

[4] I/O Data & Flag Serial Output Circuit

[4-1] Circuit Arrangement

The detailed circuit arrangement of the I/O data & flag serial output circuit 30 shown in FIG. 3 will be described with reference to FIG. 5.

The I/O data & flag serial output circuit 30 includes the flag I/O pad 31, the data I/O pad 32, a data register group 33, a flag register group 35, registers 34 and 36, exclusive-OR circuits 37 and 38, and the data & flag I/O pad 39.

The flag I/O pad 31 receives flag data. The data I/O pad 32 receives inverted or noninverted data.

The data register group 33 includes a plurality of (in this example, seven) registers 33*a*, 33*b*, 33*c*, 33*d*, 33*e*, 33*f*, and 33*g*. To transfer N-bit data, the register group 33 includes, e.g., (N−1) registers to store data of (N−1) cycles.

The flag register group 35 includes a plurality of (in this example, eight) registers 35*a*, 35*b*, 35*c*, 35*d*, 35*e*, 35*f*, 35*g*, and 35*h*. To transfer N-bit data, the register group 35 includes, e.g., N registers to store flag data generated in N cycles.

The register 34 stores flag data to check the presence/absence of inversion of the flag data itself. The register 36 stores all the flag data generated in N cycles.

Since flag data itself has a flag, the exclusive-OR circuit 37 checks based on the flag data output from the register 36 whether the flag data output from the register 34 is inverted, and reconstructs the flag data.

The exclusive-OR circuit 38 performs switching to transfer one of the data and flag data. When one input is low, the flag is transferred. When one input is low, the data is transferred.

The data & flag I/O pad 39 serially outputs both the data and the flag data.

[4-2] Operation

The I/O data & flag serial output circuit 30 having the above-described arrangement serially outputs, e.g., 8-bit I/O pad and flag data in the following manner.

When Flag Input is low, the data Data1 to Data7 of seven cycles are sequentially transferred to the register group 33 (flow (21)). The data Data1 to Data7 generated in the respective cycles are transferred to the flag register group 35 (flow (22)). On the other hand, the 8-bit flag data FlagA is transferred to the register 34 (flow (23)).

When the registers 33*a*, 33*b*, 33*c*, 33*d*, 33*e*, 33*f*, and 33*g* in the register group 33 store the data Data1 to Data7 of the seven cycles, Flag Input goes high. Then, the flag data FlagA in the register 34 is transferred to the exclusive-OR circuit 37 (flow (25)) and input to the exclusive-OR circuit 38 (flow (26)). When the flag data input is low, a flag is transferred. When the data input is low, data is transferred.

In the above operation, all the data Data1 to Data7 in the seven registers 33*a*, 33*b*, 33*c*, 33*d*, 33*e*, 33*f*, and 33*g* are output from the register group 33 (flow (24)). After that, the flag data Flag0_1 to Flag7_1 of eight cycles, which are held in the flag register group 35, are simultaneously output from the eight registers 35*a*, 35*b*, 35*c*, 35*d*, 35*e*, 35*f*, 35*g*, and 35*h* in parallel (flow (28)). The register 36 stores the flag data Flag0_1 to Flag7_1. When Flag Input goes high, the flag data Flag0_1 to Flag7_1 are transferred from the register 36 to the exclusive-OR circuit 37 (flow (29)). The exclusive-OR circuit 37 reconstructs the flag data FlagA output from the register 34 by comparing it with the flag data Flag0_1 to Flag7_1. The reconstructed flag data FlagA is input to the exclusive-OR circuit 38 (flow (26)). Since one input is low, the exclusive-OR circuit 38 directly outputs the reconstructed flag data FlagA.

As described above, in data transfer of this embodiment, all the data Data1 to Data7 and the flag data FlagA are serially output from the single pad 39.

[5] Effects

First, according to the above-described embodiment, a flag is set by comparing preceding and succeeding bus data. This obviates charge/discharge of unnecessary I/Os. It is therefore possible to average the output currents of all I/Os and consequently reduce current consumption of the I/Os during data transfer.

Figure 6A:
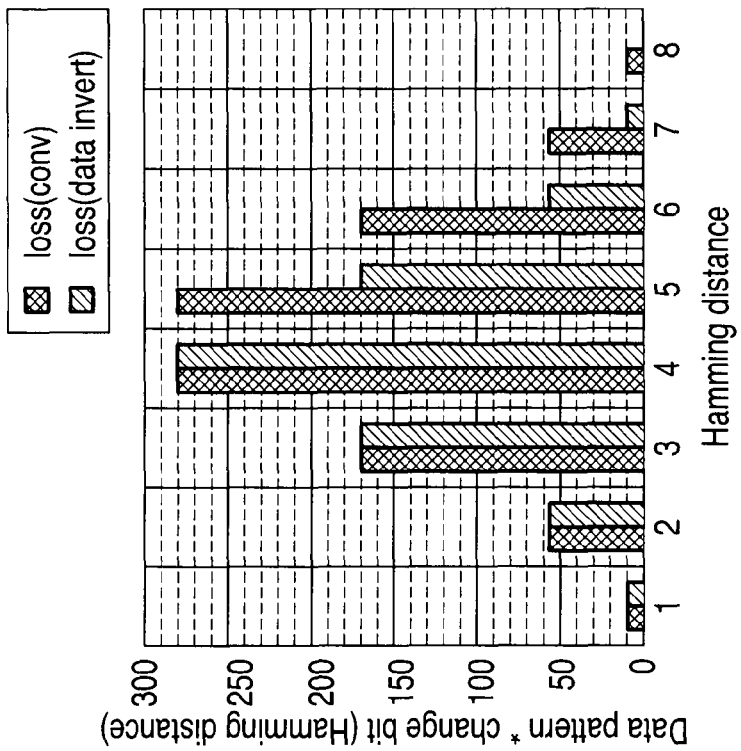
FIGS. 6A and 6B are views for explaining an effect according to an embodiment of the present invention.
Figure 6B:
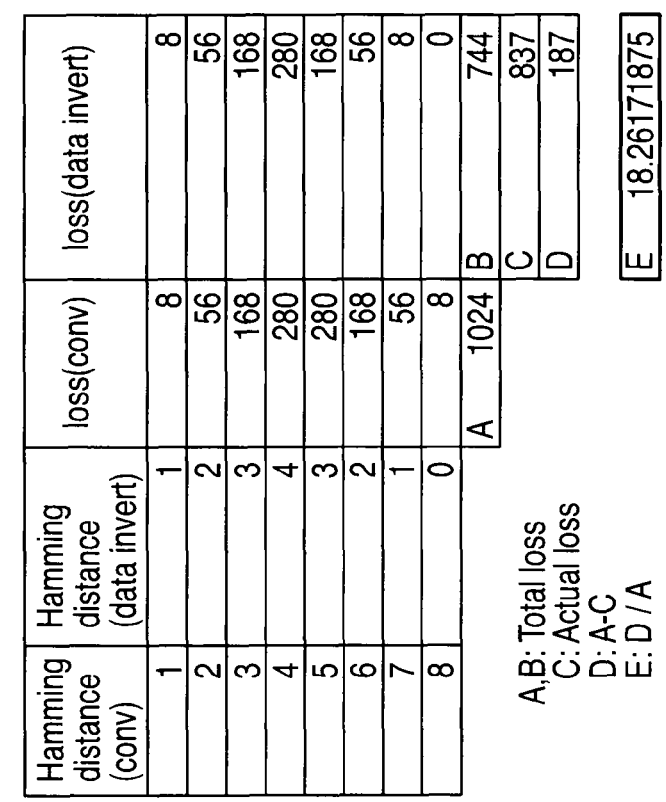

FIGS. 6A and 6B show the performance of current consumption using the data pattern differences (Hamming distances) of bus data and inverted bus data. The difference in current consumption is estimated based on the difference of normal data (conv) and that of inverted data (data invert). As is apparent from FIG. 6B, when the data difference is 5 or more, the current consumption is lower in the inverted data. The inverted data can reduce the current consumption by about 18.3% as compared to the normal data.

Second, in this embodiment, flag data is output using not the output pad for the read enable signal RE and write enable signal WE but a data output pad. Since flag data and inverted data are input to the single pad, data read and write can be done in the same cycle with the same delay. This facilitates data synchronization and simplifies the system. If a pad other than the data output pad is used for flags, the use of the pad is limited by changes in the specifications of the device, controller, and the like. In this embodiment, however, the pad can freely be used without such limitations.

Third, since flag data is output using the data output pad, no pad dedicated to flags need be added. Hence, the chip area can be smaller.

[6] Application Example

Figure 7B:
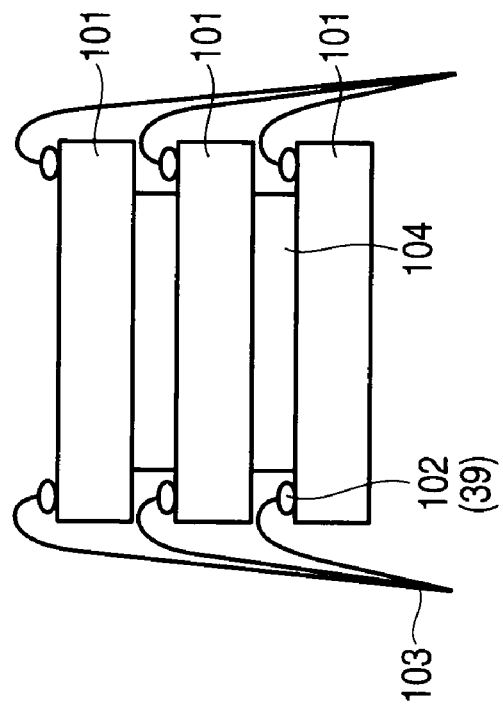
FIGS. 7A and 7B are views showing schematic arrangement of an MCP having the semiconductor device according to an embodiment of the present invention.
Figure 7A:
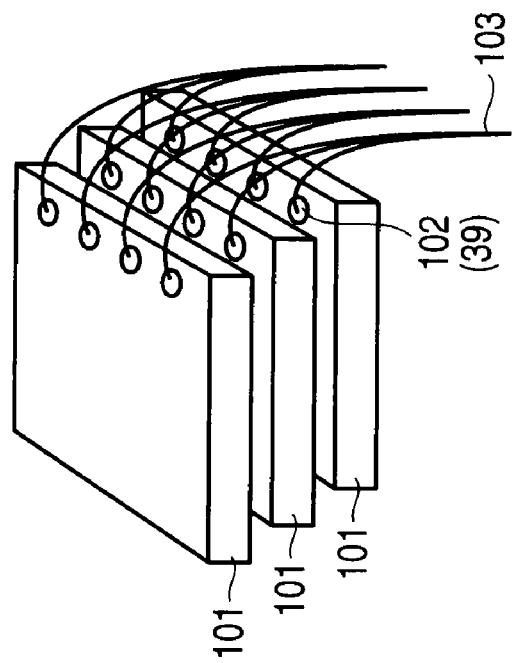

The semiconductor memory device 1 according to the embodiment is applicable to a multichip package (MCP), as shown in FIGS. 7A and 7B. More specifically, chips 101 each having the semiconductor memory device 1 of the above embodiment are stacked by MCP while inserting spacers 104 between them. Bonding pads 102 are provided on each chip 101 and connected to a substrate (not shown) via bonding wires 103. In this case, not only the same effect as described above but also the following effect can be obtained.

In this embodiment, since the data I/O pad 39, no pad for flag data need to be added, as described above. For this reason, the chip 101 can have a one-sided pad structure. When stacking the chips 101, the bonding wires 103 can easily be led from the pads 102 only by shifting the chips by a distance corresponding to the size of the bonding pads 102. The thickness of the stacked layer can equal that of only the chips 101. Even when the semiconductor memory device 1 of this embodiment is combined with a controller or another memory, the pad can freely be used. This facilitates system building.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a first exclusive-OR circuit which compares mth N-bit first data with (m+1)th N-bit second data;
    a majority circuit which generates flag data to invert the second data if a comparison result of the first exclusive-OR circuit indicates that the number of mismatch bits between the first data and the second data is not less than N/2, and generates flag data to noninvert the second data if the number of mismatch bits between the first data and the second data is less than N/2;
    a second exclusive-OR circuit which inverts or noninverts the second data based on the flag data;
    a shift register which stores the flag data generated by the majority circuit; and
    a pad to serially output both the inverted or noninverted second data and the flag data.

2. The device according to claim 1, further comprising a first register group including (N−1) registers which store the second data of (N−1) cycles.

3. The device according to claim 1, wherein
    the majority circuit generates Nth flag data based on a result obtained by causing the first exclusive-OR circuit to compare (N−1)th data with first flag data containing flag data of N cycles, and
    the second exclusive-OR circuit inverts or noninverts the first flag data based on the Nth flag data.

4. The device according to claim 3, further comprising:
    a register which stores the first flag data and checks presence/absence of inversion of the first flag data;
    a first register group including N registers which store second flag data generated in the N cycles; and
    a third exclusive-OR circuit which checks the presence/absence of inversion of the first flag data based on the second flag data output from the first register group, and if the first flag data is inverted, converts the first flag data into data before inversion.

5. The device according to claim 1, further comprising:
    a first arithmetic unit which receives (m+2)th N-bit third data, and if Flag Output is low, outputs the third data; and
    a D flip-flop which stores the second data inverted or non-inverted by the second exclusive-OR circuit and used by the first exclusive-OR circuit for comparison with the third data.

6. The device according to claim 3, further comprising
    a first arithmetic unit which receives (m+2)th N-bit third data, and if Flag Output is low, outputs the third data,
    the first arithmetic unit receiving the first flag data and, if Flag Output is high, outputting the first flag data.

7. The device according to claim 1, further comprising a third exclusive-OR circuit which performs switching to transfer one of the second data and the flag data, and transfers one of the second data and the flag data to the pad.

8. A semiconductor device formed by stacking, by MCP, chips each having a semiconductor memory device,
    the semiconductor memory device comprising:
    a first exclusive-OR circuit which compares mth N-bit first data with (m+1)th N-bit second data;
    a majority circuit which generates flag data to invert the second data if a comparison result of the first exclusive-OR circuit indicates that the number of mismatch bits between the first data and the second data is not less than N/2, and generates flag data to noninvert the second data if the number of mismatch bits between the first data and the second data is less than N/2;
    a second exclusive-OR circuit which inverts or noninverts the second data based on the flag data;
    a shift register which stores the flag data generated by the majority circuit; and
    a pad to serially output both the inverted or noninverted second data and the flag data.

9. The device according to claim 8, wherein the semiconductor memory device further comprises a first register group including (N−1) registers which store the second data of (N−1) cycles.

10. The device according to claim 8, wherein
    the majority circuit generates Nth flag data based on a result obtained by causing the first exclusive-OR circuit to compare (N−1)th data with first flag data containing flag data of N cycles, and
    the second exclusive-OR circuit inverts or noninverts the first flag data based on the Nth flag data.

11. The device according to claim 10, wherein the semiconductor memory device further comprises:
    a register which stores the first flag data to check presence/absence of inversion of the first flag data;
    a first register group including N registers which store second flag data generated in the N cycles; and
    a third exclusive-OR circuit which checks the presence/absence of inversion of the first flag data based on the second flag data output from the first register group, and if the first flag data is inverted, converts the first flag data into data before inversion.

12. The device according to claim 8, wherein the semiconductor memory device further comprises:
    a first arithmetic unit which receives (m+2)th N-bit third data, and if Flag Output is low, outputs the third data; and
    a D flip-flop which stores the second data inverted or non-inverted by the second exclusive-OR circuit and used by the first exclusive-OR circuit for comparison with the third data.

13. The device according to claim 10, wherein the semiconductor memory device further comprises:
    a first arithmetic unit which receives (m+2)th N-bit third data, and if Flag Output is low, outputs the third data,
    the first arithmetic unit receiving the first flag data and, if Flag Output is high, outputting the first flag data.

14. The device according to claim 8, wherein the semiconductor memory device further comprises a third exclusive-OR circuit which performs switching to transfer one of the second data and the flag data, and transfers one of the second data and the flag data to the pad.

* * * * *